(12) United States Patent
Clara et al.

(10) Patent No.: US 6,486,811 B2
(45) Date of Patent: Nov. 26, 2002

(54) OFFSET-FREE ANALOG-TO-DIGITAL CONVERTER

(75) Inventors: Martin Clara, Villach (AT); Andreas Wiesbauer, Pörtschach (AT); Dietmar Straeussnigg, Villach (AT)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 09/963,746

(22) Filed: Sep. 26, 2001

(65) Prior Publication Data

US 2002/0057215 A1 May 16, 2002

(30) Foreign Application Priority Data

Sep. 29, 2000 (DE) .......................................... 100 48 419

(51) Int. Cl.[7] ................................................ H03M 1/12
(52) U.S. Cl. ........................ 341/143; 341/145; 341/144; 341/141; 341/155; 341/61; 375/245; 375/222; 375/316
(58) Field of Search ................................. 341/143, 144, 341/155

(56) References Cited

U.S. PATENT DOCUMENTS

| | | | | |
|---|---|---|---|---|
| 5,150,120 A | * | 9/1992 | Yunus | 341/143 |
| 5,485,152 A | * | 1/1996 | Wilson et al. | 341/143 |
| 5,561,425 A | * | 10/1996 | Therssen | 341/143 |
| 5,625,359 A | * | 4/1997 | Wilson et al. | 341/143 |
| 5,646,621 A | * | 7/1997 | Cabler et al. | 341/143 |
| 5,838,272 A | * | 11/1998 | Steiner et al. | 341/143 |
| 5,963,160 A | * | 10/1999 | Wilson et al. | 341/143 |
| 5,973,631 A | | 10/1999 | McMullen et al. | |
| 6,081,216 A | * | 6/2000 | May | 341/143 |
| 6,100,827 A | | 8/2000 | Boesch et al. | |
| 6,121,910 A | * | 9/2000 | Khoury et al. | 341/143 |
| 6,275,177 B1 | * | 8/2001 | Ho et al. | 341/143 |

FOREIGN PATENT DOCUMENTS

| | | |
|---|---|---|
| DE | 3836823 A1 | 5/1990 |
| DE | 19701844 A1 | 7/1998 |
| DE | 19711613 A1 | 9/1998 |

* cited by examiner

Primary Examiner—Michael Tokar
Assistant Examiner—Lam T. Mai
(74) Attorney, Agent, or Firm—Jenkins & Wilson, P.A.

(57) ABSTRACT

Analog-to-digital converter for converting an analog input signal which is present at a signal input (2a, 2b) and has a specific frequency bandwidth, into an offset-free digital output signal, having a subtracting amplifier (5), which subtracts an analog actuating signal from the analog input signal in order to generate an analog difference signal and amplifies the analog difference signal generated, an analog-to-digital converter circuit (18) having a high clock rate for converting the amplified analog difference signal into the digital output signal, a digital clamping circuit (24) for digital low-pass filtering of the digital output signal, and having a digital-to-analog converter circuit (49) for converting the digital output signal filtered by the clamping circuit (24) into the analog actuating signal.

10 Claims, 1 Drawing Sheet

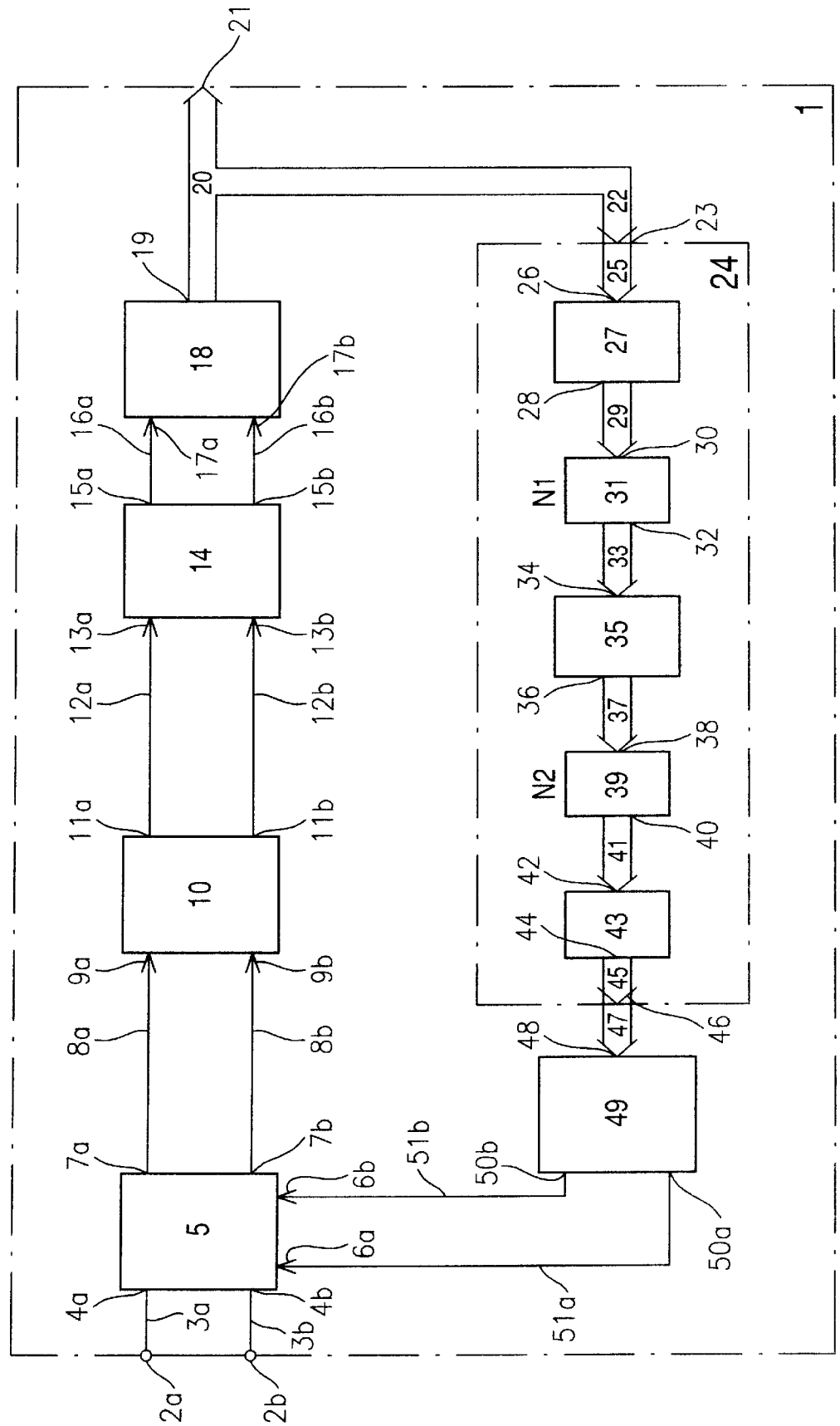

OFFSET-FREE ANALOG-TO-DIGITAL CONVERTER

TECHNICAL FIELD

The invention relates to an analog-to-digital converter for converting an analog input signal into an offset-free digital output signal.

RELATED ART

Digital signal processing systems are in widespread use. Since digital signal processing systems have numerous technical and economical advantages over analog circuits, digital signal processing systems are replacing the conventional analog circuits to an increasing extent.

The transmission of signals is analog in many cases on account of an only limited bandwidth available in the transmission medium, with the result that an analog-to-digital converter is connected upstream of the digital signal processing systems.

It is advantageous for the further data processing of the converted digital signal if the converted digital signal is offset-free, i.e. has no DC component. A DC offset compensation on the one hand has the effect that the digital output data converted by the analog-to-digital converter have a zero mean value, and on the other hand increases the dynamic range of the analog-to-digital converter.

U.S. Pat. No. 5,523,756 describes an analog-to-digital converter having feedback for offset reduction. The analog-to-digital converter described therein detects the presence of an analog input signal with a mean value. The analog input signal is converted into a digital output signal by an analog-to-digital converter, the less significant bits of the digital output signal being compared with a threshold value in order to generate an indicator signal which specifies whether or not an analog input signal is present. DC-component offsets in the digital output signal are compensated by the generation of a DC compensation signal based on the most significant bit of the digital signal with respect to a reference voltage. The DC compensation signal is added to the analog input signal prior to conversion into the digital output signal. The DC compensation signal or actuating signal is generated by means of analog filtering of the digital output signal.

However, analog filtering of the digital output signal for the purpose of generating an actuating signal for DC offset compensation of the analog-to-digital converter has a number of disadvantages.

A circuitry realization of analog filtering is relatively area-intensive in the integration of the analog-to-digital converter, i.e. a relatively large chip area is required for it.

Furthermore, external circuit components, such as coupling capacitors, for example, are necessary.

A further disadvantage is the relatively inflexible circuitry implementation of the analog filtering.

SUMMARY OF THE INVENTION

The object of the present invention, therefore, is to provide an analog-to-digital converter with offset compensation which can be realized in a simple manner in terms of circuitry and can be implemented flexibly.

This object is achieved according to the invention by means of an analog-to-digital converter having the features specified in patent claim 1.

BRIEF DESCRIPTION OF THE DRAWINGS

FIG. 1 is a schematic drawings of a preferred embodiment of the analog-to-digital converter of the present invention.

DETAILED DESCRIPTION OF THE INVENTION

The invention provides an analog-to-digital converter for converting an analog input signal which is present at a signal input and has a specific frequency bandwidth, into an offset-free digital output signal, the analog-to-digital converter having:

a subtracting amplifier, which subtracts an analog actuating signal from the analog input signal in order to generate an analog difference signal and amplifies the analog difference signal, an analog-to-digital converter circuit having a high clock rate for converting the amplified analog difference signal into the digital output signal, a digital clamping circuit for digital low-pass filtering of the digital output signal, and a digital-to-analog converter circuit for converting the digital output signal filtered by the clamping circuit into the analog actuating signal.

In the case of the analog-to-digital converter according to the invention, the DC compensation is achieved by digital low-pass filtering of the digital output signal. The implementation of the digital filtering is very flexible since the circuitry implementation can be described in VHDL code, i.e. a description language for digital circuits. The VHDL code can be transferred to different technologies in a relatively simple manner. The circuitry implementation can therefore be changed flexibly for the different filter characteristics desired. Furthermore, digitally constructed filters are less area-intensive than analog filters in the context of integration, with the result that the analog-to-digital converter according to the invention requires only a relatively small chip area.

In a preferred embodiment of the analog-to-digital converter according to the invention, the digital clamping circuit decimates the digital output signal in order to reduce the clock rate.

The decimation of the clock rate has the advantage that the DC offset compensation is robust and interference-immune. On account of the reduced clock rate, it is possible to use digital filters of particularly simple construction in circuitry terms in the digital clamping circuit. Furthermore, the DC offset compensation regulation is stabler on account of the lower clock rate.

In a preferred embodiment of the analog-to-digital converter according to the invention, the digital clamping circuit contains a first digital low-pass filter for the low-pass filtering of the digital output signal;

a first decimation circuit for the decimation of the digital output signal—filtered by the first low-pass filter—with a first decimation factor;

a second digital low-pass filter for the low-pass filtering of the output signal decimated by the first decimation circuit, and a second decimation circuit for the further decimation of the output signal—filtered by the second low-pass filter—with a second decimation factor.

The multistaged decimation makes it possible to use digital low-pass filters which are of particularly simple construction in circuitry terms.

The first low-pass filter is preferably a comb filter.

In a particularly preferred embodiment of the analog-to-digital converter according to the invention, the clamping circuit has an integrator circuit connected downstream of the second decimation circuit.

The digital low-pass filters of the clamping circuit preferably have a low cut-off frequency, in order to selectively filter the DC signal components.

An analog anti-aliasing filter is preferably connected downstream of the subtracting amplifier.

An analog signal amplifier is preferably connected downstream of the anti-aliasing filter.

In a particularly preferred embodiment of the analog-to-digital converter according to the invention, the analog subtracting amplifier, the analog anti-aliasing filter, the analog signal amplifier, the analog-to-digital converter circuit and the digital-to-analog converter circuit are of fully differential construction.

The analog-to-digital converter according to the invention is preferably used for converting an xDSL signal into a digital output signal.

Furthermore, a preferred embodiment of the analog-to-digital converter according to the invention is described with reference to the accompanying FIGURE in order to elucidate features which are essential to the invention.

The analog-to-digital converter 1 according to the invention has a fully differential analog signal input 2a, 2b for applying an analog input signal to be converted. The analog signal is an arbitrary analog input signal which has a specific frequency bandwidth. The frequency bandwidth of a voice signal as useful signal is 0 to 4 kHz, for example, while the frequency bandwidth of an analog ADSL input signal is 1.1 MHz.

The analog input signal present at the analog signal input 2a, 2b is fed via signal lines 3a, 3b to the signal input 4a, 4b of a subtracting amplifier 5 of fully differential construction. The subtracting amplifier 5 has a second fully differential input 6a, 6b for receiving an analog actuating signal. The subtracting amplifier subtracts the analog actuating signal present at the input 6a, 6b from the analog input signal present at the input 4a, 4b and amplifies the analog difference signal thus formed. The amplified analog difference signal is output from the subtracting amplifier 5 at a signal output 7a, 7b via signal lines 8a, 8b to a signal input 9a, 9b of an anti-aliasing filter 10 of fully differential construction.

The anti-aliasing filter is, for example, an analog Butterworth filter having a specific cut-off frequency. The fully differential signal output 11a, 11b of the anti-aliasing filter 10 is connected via lines 12a, 12b to a signal input 13a, 13b of an analog signal amplifier 14.

The analog signal amplifier 14 is preferably likewise of fully differential construction. The analog signal amplifier 14 has a signal output 15a, 15b, which is connected via lines 16a, 16b to an analog signal input 17a, 17b of an analog-to-digital converter circuit 18.

The analog-to-digital converter circuit 18 has a high sampling clock rate of 133 MS/s, for example. The analog-to-digital converter circuit 18 has a digital signal output 19 for outputting a digital output signal. The digital signal output 19 has a specific bit width n. The bit width n of the digital output signal is 10 bits, for example. The digital signal output 19 of the analog-to-digital converter circuit 18 is connected to a digital signal output 21 of the analog-to-digital converter 1 according to the invention via a data bus 20 having a width of n bits. The digital output signal is passed via feedback lines 22 to a signal input 23 of a clamping circuit 24.

The clamping circuit 24 fixedly clamps the DC offset value to a value zero. The digital signal present at the digital signal input 23 of the clamping circuit 24 is applied via lines 25 to a signal input 26 of a first digital low-pass filter 27.

The digital low-pass filter 27 carries out digital low-pass filtering of the digital signal present, the cut-off frequency of the low-pass filter 27 corresponding to the frequency bandwidth of the analog useful signal present at the analog-to-digital converter 1. The first low-pass filter 27 has a signal output 28, which is connected via lines 29 to a signal input 30 of a first decimation circuit 31.

The first decimation circuit 31 decimates the filtered digital signal present by a decimation factor N1. The decimation factor N1 of the first decimation circuit 31 is 256 in a preferred embodiment.

The first decimation circuit 31 has a signal output 32, which is connected via lines 33 to a signal input 34 of a further digital low-pass filter 35. The cut-off frequency of the second digital low-pass filter 35 likewise corresponds to the frequency bandwidth of the analog useful signal present. The second digital low-pass filter 35 has a signal output 36, which is connected via lines 37 to a signal input 38 of a second decimation circuit 39.

The second decimation circuit 39 decimates the digital signal present by a decimation factor N2. The second decimation factor N2 is 64 in a particularly preferred embodiment. The second decimation circuit 39 has a signal output 40, which is connected via lines 41 to a signal input 42 of an integrator circuit 43.

The digital integrator circuit 43 integrates the decimated and filtered signal present to form a digital actuating signal which is output via a signal output 44 and lines 45 to a signal output 46 of the clamping circuit 24. The signal output 46 of the clamping circuit 24 is connected via lines 47 to a signal input 48 of a digital-to-analog converter circuit 49.

The digital-to-analog converter circuit 49 converts the digital actuating signal present into an analog actuating signal and outputs the analog actuating signal via a fully differential analog signal output 50a, 50b and lines 51a, 51b to the signal input 6a, 6b of the analog subtraction amplifier 5.

The clamping circuit 24 has two decimation circuits 31, 39, by means of which the digital output signal of the analog-to-digital converter circuit 18 is decimated in a two-stage manner. The decimation reduces the required clock rate at which the digital low-pass filters of the clamping circuit operate, with the result that low-pass filters 27, 35 of particularly simple construction can be used.

The first digital low-pass filter 27 is a comb filter having the following transfer function:

$$H_{27}(z) = \frac{1 - z^{-N1}}{1 - z^{-1}} \tag{1}$$

where N1 is the decimation factor of the first decimation circuit 31.

The second low-pass filter 35 has the following general transfer function:

$$H_{35}(z) = \frac{a_0 + a_1 z^{-1} + \ldots a_m z^{-m}}{b_0 + b_1 z^{-1} + \ldots b_m z^{-m}} \tag{2}$$

where m can be chosen as desired. In a preferred embodiment, m is 1, i.e. the second digital low-pass filter 35 has a very simple structure in circuitry terms.

The integrator circuit 43 connected downstream of the second decimation circuit 39 has the following transfer function:

$$H_{43}(z) = \frac{1}{1-z^{-1}} \quad (3)$$

The digital actuating signal fed to the signal input 48 of the digital-to-analog converter circuit 49 is decimated relative to the digital output signal of the analog-to-digital converter 18 by a factor N, where:

$$N = N_1 \cdot N_2 \quad (4)$$

The clock rate in the regulating loop is reduced by the factor N relative to the sampling rate of the analog-to-digital converter circuit 18.

The regulating loop corrects the DC voltage offset of the analog input signal in such a way that the digital output data of the analog-to-digital converter 1 according to the invention have a zero mean value or have no DC offset voltage. In this case, a precision clock is not required, rather the existing signal clock of the analog-to-digital converter circuit 18 can be used for clocking the clamping circuit 24. The digital low-pass filters 27, 35 can be described by a VHDL description language in a simple manner and can thus be transferred to different technologies in a simple manner. The filter characteristics realized by the digital low-pass filters 27, 35 can be adapted to the frequency bandwidths of the analog input signal to be converted. The elimination of the DC component by the regulating loop has the effect that the digital output data have a zero mean value and increases the dynamic range of the analog-to-digital conversion.

What is claimed is:

1. An analog-to-digital converter for converting an analog input signal which is present at a signal input and has a specific frequency bandwidth, into an offset-free digital output signal, having:

(a) a subtracting unit, which subtracts an analog actuating signal from the analog input signal in order to generate an analog difference signal and amplifies the analog difference signal generated;

(b) an analog-to-digital converter circuit having a high clock rate for converting the amplified analog difference signal into a digital difference signal;

(c) a digital processing circuit for digital processing of the digital difference signal; and (d) a digital-to-analog converter circuit for converting the digital difference signal processed by the digital processing circuit into the analog actuating signal, wherein (b1) the digital difference signal is the digital output signal of the analog-to-digital converter;

(c1) the digital processing circuit performs digital low-pass filtering of the digital output signal; and (c2) the digital processing circuit decimates the digital output signal in order to reduce the clock rate, in which case (c3) the digital processing circuit is arranged in the feedback path of the analog-to-digital converter; and (c4) the digital processing circuit is embodied as a digital clamping circuit and clamps the DC offset value of the digital output signal to a value equal to zero.

2. The analog-to-digital converter as claimed in claim 1, wherein the digital clamping circuit decimates the digital output signal in order to reduce the clock rate.

3. The analog-to-digital converter as claimed in claim 1, wherein the digital clamping circuit has:

a first digital low-pass filter for the low-pass filtering of the digital output signal;

a first decimation circuit for the decimation of the digital output signal-filtered by the first low-pass filter—with a first decimation factor;

a second digital low-pass filter for the low-pass filtering of the output signal decimated by the first decimation circuit, and a second decimation circuit for the further decimation of the output signal—filtered by the second low-pass filter—with a second decimation factor.

4. The analog-to-digital converter as claimed in claim 3, wherein the first low-pass filter is a comb filter.

5. The analog-to-digital converter as claimed in claim 3, wherein the clamping circuit has a digital integrator circuit connected downstream of the second decimation circuit.

6. The analog-to-digital converter as claimed in claim 3, wherein the digital low-pass filters of the clamping circuit each have a low cut-off frequency for selective filtering of the DC signal components.

7. The analog-to-digital converter as claimed in claim 1, wherein an analog anti-aliasing filter is connected downstream of the subtracting amplifier.

8. The analog-to-digital converter as claimed in claim 7, wherein an analog signal amplifier is connected downstream of the anti-aliasing filter.

9. The analog-to-digital converter as claimed in claim 8, wherein the analog subtracting amplifier, the analog anti-aliasing filter, the analog signal amplifier, the analog-to-digital converter circuit and the digital-to-analog converter circuit are of fully differential construction.

10. The use of the analog-to-digital converter as claimed in claim 1 for converting an xDSL signal into a digital output signal.

* * * * *